(12) United States Patent
Heile

(10) Patent No.: US 6,347,061 B1
(45) Date of Patent: Feb. 12, 2002

(54) PROGRAMMABLE LOGIC ARRAY DEVICE WITH RANDOM ACCESS MEMORY CONFIGURABLE AS PRODUCT TERMS

(75) Inventor: Francis B. Heile, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/599,764

(22) Filed: Jun. 22, 2000

Related U.S. Application Data (63) Continuation of application No. 09/443,970, filed on Nov. 19, 1999, now Pat. No. 6,118,720, which is a continuation of application No. 09/034,050, filed on Mar. 3, 1998, now Pat. No. 6,020,759.
(60) Provisional application No. 60/041,046, filed on Mar. 21, 1997.

(51) Int. Cl.[7] .................................................. G11C 7/00
(52) U.S. Cl. ........................... 365/230.01; 365/230.03; 365/230.06; 365/230.08
(58) Field of Search ....................... 365/189.01, 230.01, 365/230.02, 230.06, 230.08, 189.02; 326/39, 40, 41

(56) References Cited

U.S. PATENT DOCUMENTS

| | | | |
|---|---|---|---|
| 3,473,160 A | 10/1969 | Wahlstrom | 340/172.5 |
| 3,849,638 A | 11/1974 | Greer | 235/152 |
| 4,740,917 A | 4/1988 | Denis et al. | 365/49 |

(List continued on next page.)

OTHER PUBLICATIONS

C. Barre, "L'utilisation du FPLA; Evaluez les Applications d'un Composant Composant qui Peut se Reeler trés Economique", Electronique & Applications Industrielles, EAI 250, Apr. 1, 1978, pp. 21–25.

D. Bursky, "Combination RAM/PLD Opens New Application Options", Electronic Design, May 23, 1991, pp. 138–140.

"iFX8160 10ns FLEXlogic FPGA with SRAM Option; Advance Information", Intel Corporation, Oct. 1993, pp. 2–47 through 2–56.

T. K–K. Ngai, "An SRAM–Programmable Field–Reconfigurable Memory", Master of Applied Science degree thesis submitted to the Department of Electrical Engineering of the University of Toronto, 1994.

A. Stansfield et al., "The Design of a New FPGA Architecture", Proceedings Field Programmable Logic (FPL) 1995, Springer Lecture Notes in Computer Science 975, pp. 1–14.

A. Kaviani et al., "Hybrid FPGA Architecture", Proceedings 4th International Symposium on FPGAs (FPGA 96), Feb. 1996.

Reddy, S. et al., "A High Density Embedded Array Programmable Logic Architecture", IEEE 1996 Custom Integrated Circuits Conference, May 5, 1996, pp. 251–254.

(List continued on next page.)

Primary Examiner—Viet Q. Nguyen
(74) Attorney, Agent, or Firm—Fish & Neave; Robert R. Jackson; Joo-Youn Park (57) ABSTRACT

A look-up-table-based programmable logic device is provided with memory circuitry which can be operated either as random access memory ("RAM") or to perform product term ("p-term") logic. Each individual row of the memory is separately addressable for writing data to the memory or, in RAM mode, for reading data from the memory. Alternatively, multiple rows of the memory are addressable in parallel to read p-terms from the memory. The memory circuitry of the invention is particularly useful as an addition to look-up-table-type programmable logic devices because the p-term capability of the memory circuitry provides an efficient way to perform wide fan-in logic functions which would otherwise require trees of multiple look-up tables.

23 Claims, 7 Drawing Sheets-

U.S. PATENT DOCUMENTS

| | | | | |
|---|---|---|---|---|
| 4,876,466 | A | 10/1989 | Kondou et al. | 307/465 |
| 4,912,345 | A | 3/1990 | Steele et al. | 307/465 |
| 4,975,601 | A | 12/1990 | Steele | 307/465 |
| 5,027,011 | A | 6/1991 | Steele | 307/465 |
| 5,099,150 | A | 3/1992 | Steele | 307/465 |
| 5,121,006 | A | 6/1992 | Pedersen | 307/465 |
| 5,128,559 | A | 7/1992 | Steele | 307/465 |
| 5,144,582 | A | 9/1992 | Steele | 365/189.08 |
| RE34,363 | E | 8/1993 | Freeman | 307/465 |
| 5,270,587 | A | 12/1993 | Zagar | 307/469 |
| 5,302,865 | A | 4/1994 | Steele et al. | 307/465 |
| 5,362,999 | A | 11/1994 | Chiang | 326/44 |
| 5,383,146 | A | 1/1995 | Threewitt | 365/49 |
| 5,386,155 | A | 1/1995 | Steele et al. | 326/37 |
| 5,408,434 | A | 4/1995 | Stansfield | 365/189.08 |
| 5,450,608 | A | 9/1995 | Steele | 395/800 |
| 5,473,267 | A | 12/1995 | Stansfield | 326/41 |
| 5,532,957 | A | 7/1996 | Malhi | 365/154 |
| 5,550,782 | A | 8/1996 | Cliff et al. | 365/230.03 |
| 5,557,218 | A | 9/1996 | Jang | 326/40 |
| 5,559,450 | A | 9/1996 | Ngai et al. | 326/40 |
| 5,559,747 | A | 9/1996 | Kasamizugami et al. | 365/207 |
| 5,689,195 | A | 11/1997 | Cliff et al. | 326/41 |
| 5,744,980 | A | 4/1998 | McGowan et al. | 326/40 |
| 5,757,207 | A | 5/1998 | Lytle et al. | 326/39 |
| 5,809,281 | A | 9/1998 | Steele et al. | 395/497.01 |
| 5,812,479 | A * | 9/1998 | Cliff et al. | 365/230.03 |
| 5,815,003 | A | 9/1998 | Pedersen | 326/39 |
| 5,828,229 | A | 10/1998 | Cliff et al. | 326/40 |
| 5,848,005 | A * | 12/1998 | Cliff et al. | 365/230.03 |
| 5,883,850 | A * | 3/1999 | Lee et al. | 365/230.03 |
| 6,020,759 | A | 2/2000 | Heile | 326/40 |
| 6,028,808 | A * | 2/2000 | Cliff et al. | 365/230.03 |
| 6,052,327 | A * | 4/2000 | Reddy et al. | 365/230.05 |
| 6,118,720 | A * | 9/2000 | Heile | 365/230.01 |

OTHER PUBLICATIONS

Brown, S. et al., "FPGA and CPLD Architectures: A Tutorial", IEEE Design & Test of Computers, Jun. 1, 1996, pp. 42–57.

Nelson, R. "Embedded memory enhances programmable logic for complex, compact designs", Electrical Design News (EDN), vol. 41, No. 23, Nov. 7, 1996, pp. 91, 92, 94, 96, 98, 100–102, and 106.

"Altera Enables System–Level Integration with Raphael Family of Embedded PLDs", Altera Corporation, San Jose, California, Aug. 31, 1998.

"Apex 20K Programmable Logic Device Family; Advanced Product Brief", Altera Corporation, San Jose, California, Oct. 1998, pp. 1, 2, and 9.

"Altera Unveils New Name for Raphael: Advanced Programmable Embedded Matrix (APEX)", Altera Corporation, San Jose, California, Oct. 7, 1998.

"Apex 20K Device Family; The Embedded PLD Family for System–Level Integration", Altera Corporation, San Jose, California, after Aug. 31, 1998.

"Apex 20K Device Family; Breakthrough MultiCore Architecture", Altera Corporation, San Jose, California, after Aug. 31, 1998.

F. Heile et al., "Hybrid Product Term and LUT Based Architecture Using Embedded Memory Blocks", Proceedings of FPGA 1999 Conference, Feb. 21–23, 1999, Montery, California.

"Next Generation FPGAs; Xilinx Next Generation FPGAs Deliver World–Class Performance", *The Power of Innovation 1997*, Xilinx, Inc., San Jose, CA. p. 7–7.

* cited by examiner

PROGRAMMABLE LOGIC ARRAY DEVICE WITH RANDOM ACCESS MEMORY CONFIGURABLE AS PRODUCT TERMS

This application claims the benefit of U.S. provisional application No. 60/041,046, filed Mar. 21, 1997. This application is a continuation of application Ser. No. 09/443,970, filed Nov. 19, 1999, now U.S. Pat. No. 6,118,720, which is a continuation of application Ser. No. 09/034,050, filed Mar. 3, 1998, now U.S. Pat. No. 6,020,759, which are hereby incorporated by reference herein in their entireties.

BACKGROUND OF THE INVENTION

This invention relates to programmable logic array devices having embedded random access memory arrays which can be configured as programmable product-term-type logic elements if desired. More particularly, the invention relates to programmable logic devices having look-up tables for performing logic and larger blocks of random access memory which are usable by the user for such purposes as data storage and additional look-up table logic, and which larger blocks of random access memory are alternatively configurable as programmable product-term-type logic elements.

One known type of programmable logic device includes an array of programmable AND gates which typically produces multiple outputs, each generally resulting from the ANDing of multiple inputs. These AND gate array outputs are commonly referred to as "product terms" because the logical representation of the AND function is analogous to multiplication. Generally, a plurality of these product terms, or "p-terms," are combined by an OR gate to produce a sum-of-products output (the OR function being analogous to addition).

Another type of programmable logic device is implemented using many relatively small look-up tables whose inputs are either the inputs of the programmable logic device or the outputs of other look-up tables in the device.

Programmable logic architectures have recently been developed in which relatively large, user-configurable blocks of random access memory (RAM) are provided among blocks of look-up-table-type programmable logic. One such architecture is described in Cliff et al. U.S. Pat. No. 5,689,195, which is hereby incorporated by reference herein in its entirety. These user-configurable memory blocks can be used as general-purpose memory for the device, or they can be used as additional relatively large look-up-table-type logic blocks.

Look-up-table-type logic may have a disadvantage relative to p-term-type logic with respect to the number of inputs to a logic function that can be implemented in one reasonably sized block of circuitry. For example, the above-mentioned Cliff et al. reference shows devices having many four-input look-up tables and several relatively large blocks of user-configurable RAM that can function as eight- to 11-input look-up tables. To perform logic functions of more than 11 inputs in such a device it is necessary to use a tree of the available look-up table units. It is not practical to redesign devices of this kind with larger user-RAM blocks to individually act as look-up tables having significantly larger numbers of inputs (e.g., 20, 30, or more inputs) because such RAM blocks would have to be extremely large. However, p-term-type logic arrays with 20, 30, or even more inputs are not excessively large and can therefore more readily provide outputs which are functions of large numbers of inputs.

In view of the foregoing, it is an object of this invention to provide look-up-table-type programmable logic devices with the capability of more readily performing some logic functions having large numbers of inputs.

It is another object of this invention to provide look-up-table-type programmable logic devices which include relatively large blocks of user-configurable RAM with the capability of optionally performing some logic functions using p-term-type logic in the user-configurable RAM if desired.

SUMMARY OF THE INVENTION

These and other objects of the invention are accomplished in accordance with the principles of the invention by providing programmable logic devices having look-up-table-type logic and relatively large blocks of user-configurable RAM which are optionally usable to perform p-term-type logic. For storing data in a RAM block, or for using the RAM block as ordinary memory (including additional look-up table logic), circuitry is provided for addressing the various rows of the block one at a time on an individual basis. For using a RAM block to perform p-term-type logic, additional circuitry is provided for alternatively addressing multiple rows of the block in parallel. For each column of memory locations in a RAM block, the contents of the rows that are addressed in parallel are logically ANDed to produce a p-term output of the contents of those rows. OR logic circuitry is provided for selective use to logically OR various column outputs and thereby produce sum-of-products output signals when the RAM block is being used in p-term mode.

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
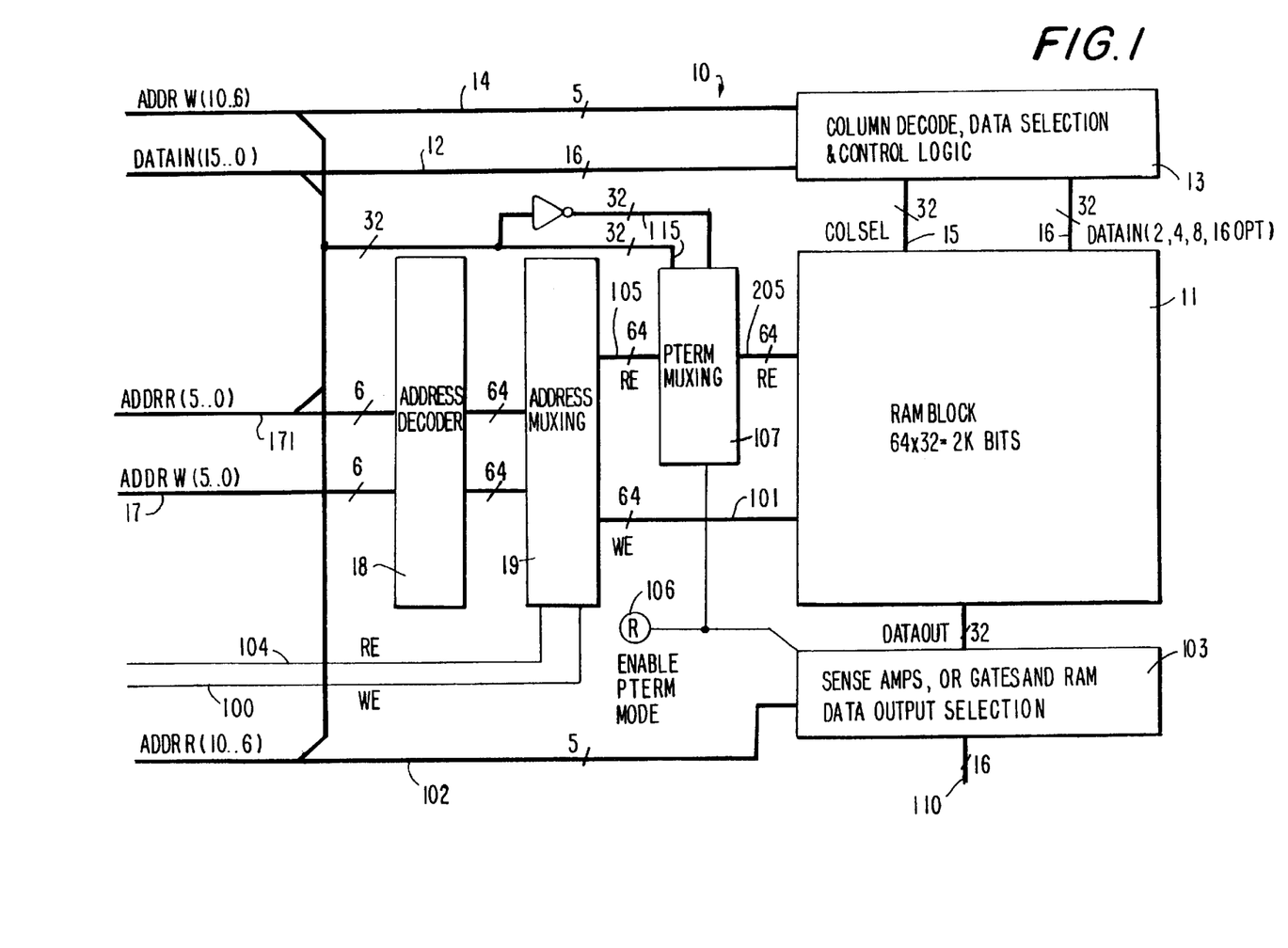
FIG. 1 is a schematic representation of an illustrative embodiment of a random access memory array configured according to the present invention for use as either random access memory or p-term-type logic.

An illustrative random access memory module 10 configured according to the present invention is shown in FIG.

Figure 2:
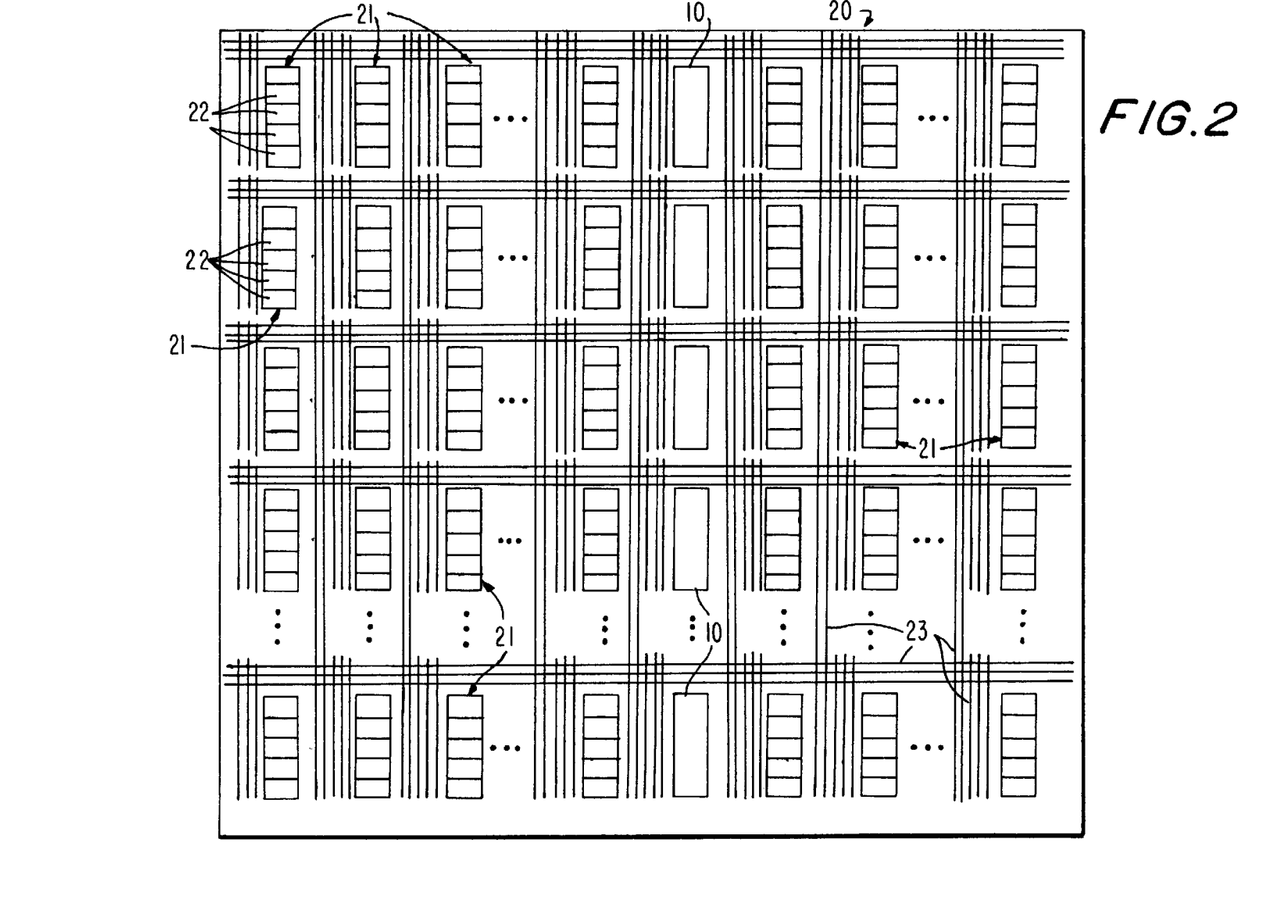
FIG. 2 is a simplified schematic representation of an illustrative look-up-table-type programmable logic device incorporating random access memory blocks which can be constructed in accordance with the invention.
Figure 6:
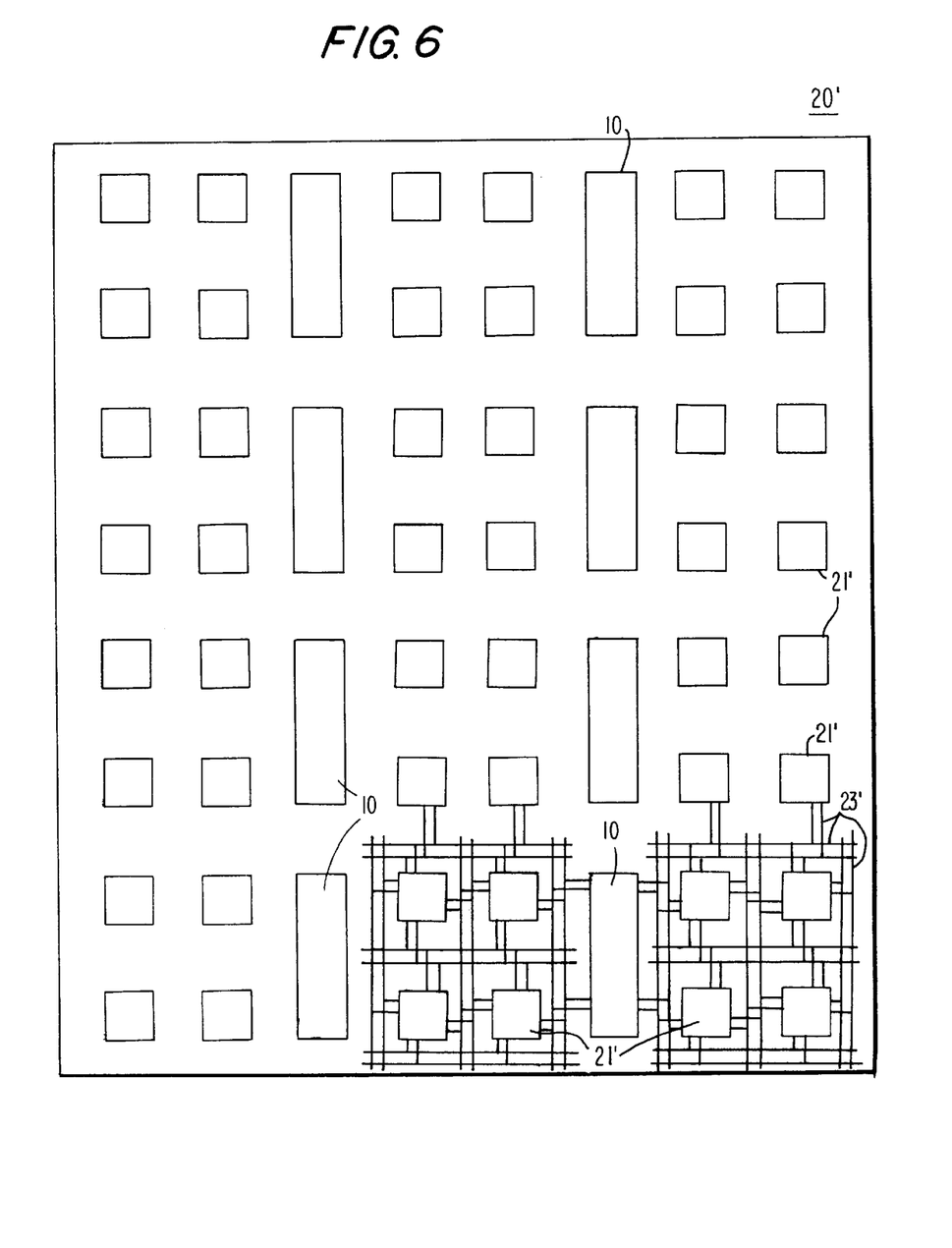
FIG. 6 is a simplified schematic representation of another illustrative look-up-table-type programmable logic device incorporating random access memory blocks which can be constructed in accordance with this invention.

1. RAM module 10 can be an embedded array block in a programmable logic device having an architecture such as that described in the above-mentioned Cliff et al. reference, or any other type of device having embedded RAM blocks or modules. FIG. 2 shows how a plurality of RAM blocks 10 can be embedded among the logic blocks 21 of programmable logic device 20. Each of logic blocks 21 is made up of several logic modules 22, each of which includes a four-input look-up table. Additional structure of device 20 (including interconnection conductor network 23) can be as shown and described in the above-mentioned Cliff et al. reference. Another example of a programmable logic device which can include embedded RAM blocks 10 in accordance with the invention is shown in FIG. 6 and described later in this specification.

At the heart of RAM module 10 is the RAM array 11. The illustrative RAM module 10 shown in FIG. 1 has one 16-bit write port (DataIn bus conductors 12) and one 16-bit read port (conductors 110). As shown in FIG. 1, RAM array 11 is a two kilobit array arranged as 64 by 32 bits. RAM array 11 can be written by inputting up to 16 bits of data at one time on DataIn bus 12, which feeds column decode, data selection and control logic 13. Column control logic 13 uses write address data bits 10 through 6 on AddrW lines 14 to decode and select for which columns of array 11 the data on lines 12 are intended. Thirty-two column select lines 15 and 32 data lines 16 connect column control logic 13 to array 11. Additional address data bits 5 through 0, for indicating for which row the data on lines 12 is intended, are input on AddrW lines 17 and are decoded by address decoder 18 and address multiplexer 19. When write enable input 100 is high, address multiplexer 19 passes the decoded address data to array 11 on the addressed one of write enable lines 101. In other words, when writing data to RAM array 11, elements 18 and 19 operate to select the write enable input 101 for the one of 64 rows of the RAM array that is addressed by AddrW bits 5 through 0.

Figure 3:
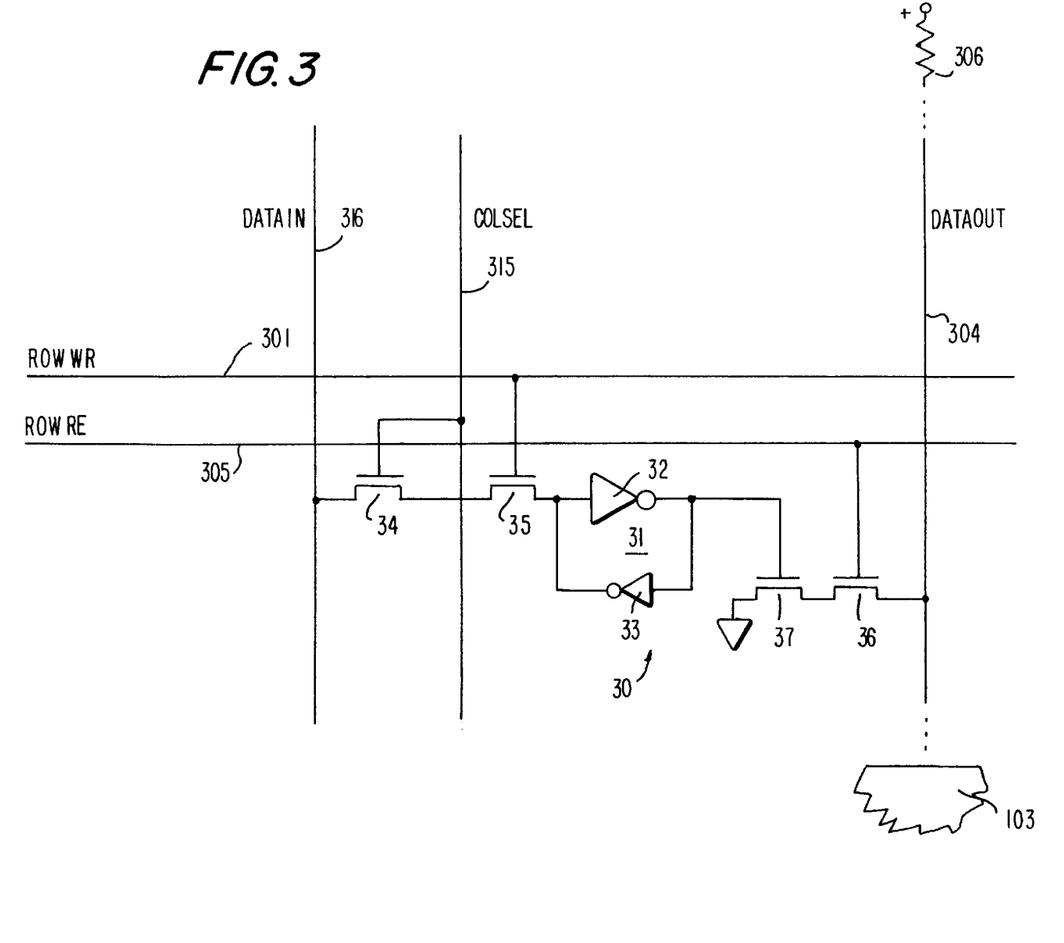
FIG. 3 is a schematic representation of an illustrative embodiment of a random access memory cell according to the present invention.

As seen in FIG. 3, when for a given RAM cell 30 both the associated column select line 315 and the associated row write select line 301 are high, the datum on the associated DataIn line 316 is coupled to storage element 31 (generally comprising strong inverter 32 and weak inverter 33 coupled together in a closed loop series) through field effect transistors 34, 35 respectively.

In read mode, when module 10 is used as ordinary RAM, row address data bits 5 through 0 are provided on AddrR lines 171 and column address data bits 10 through 6 are provided on AddrR lines 102. The column address data on lines 102 control the data output selection logic of output control module 103 to select the columns of RAM array 11 from which data will be output via leads 110. The row address data that are input on lines 171 are decoded by address decoder 18 and address multiplexer 19. When read enable input 104 is high, address multiplexer 19 passes the decoded address data to array 11 on the addressed one of 64 read address lines 105. Assuming that p-term mode is not enabled by an appropriate signal from programmable Enable P-term Mode function control element ("FCE") 106, the decoded address data on lines 105 pass unchanged through p-term address multiplexer 107 onto lines 205 and into array 11 to select one row in the array for reading.

As can be seen, if a particular cell is selected, by virtue of the associated row read line 305 being high, field effect transistor 36 connects memory element 31 to data out line 304, which can be read if it is selected by logic 103. When transistor 36 is turned on by row read line 305, then if element 31 contains a logic "1", transistor 37 pulls data out line 304, held high by pull-up 306, toward ground. Reading the output of line 304 may require a sense amplifier, even when RAM module 10 is used as ordinary RAM, and output control logic 103 therefore preferably includes a sense amplifier, which may be conventional, for each output line 304.

When module 10 is used in p-term mode (by appropriately programming FCE 106), only reading is affected. In p-term mode, p-term address multiplexer 107 disconnects address lines 205 from address lines 105, and connects them instead to 64 p-term inputs on lines 115, which are the true and complement of the 32 signals on address inputs 14, 102, and 171 and data inputs 12. Inputs 12, 14 are available as p-term inputs because they are not normally used in read mode. This particular choice of input signals for p-term mode is arbitrary, and instead any other signals could be used for part or all of the 32 p-term mode inputs described in the immediately preceding sentences. Lines 205 thus select multiple rows at a time, so that each output line 304 becomes a p-term of the 64 true and complement signals to the extent that in the column associated with that output line the various memory cells are programmed logic "1". In particular, each line 304 is pulled low if any of the cells 30 on that line is programmed with a logic "1" and is selected by a logic "1" on the associated row read line 305. Again, the output on each line 304 is read by a sense amplifier in control logic 103. Control logic 103 may also contain one or more OR gates, to each of which two or more of the p-terms on lines 304 can be connected for a sum-of-products output. Logic 103 may also include flip-flops or other register elements to optionally provide registered outputs. An illustrative embodiment of representative portions of logic 103 is shown in more detail in FIG. 4, which will now be described.

Figure 4:
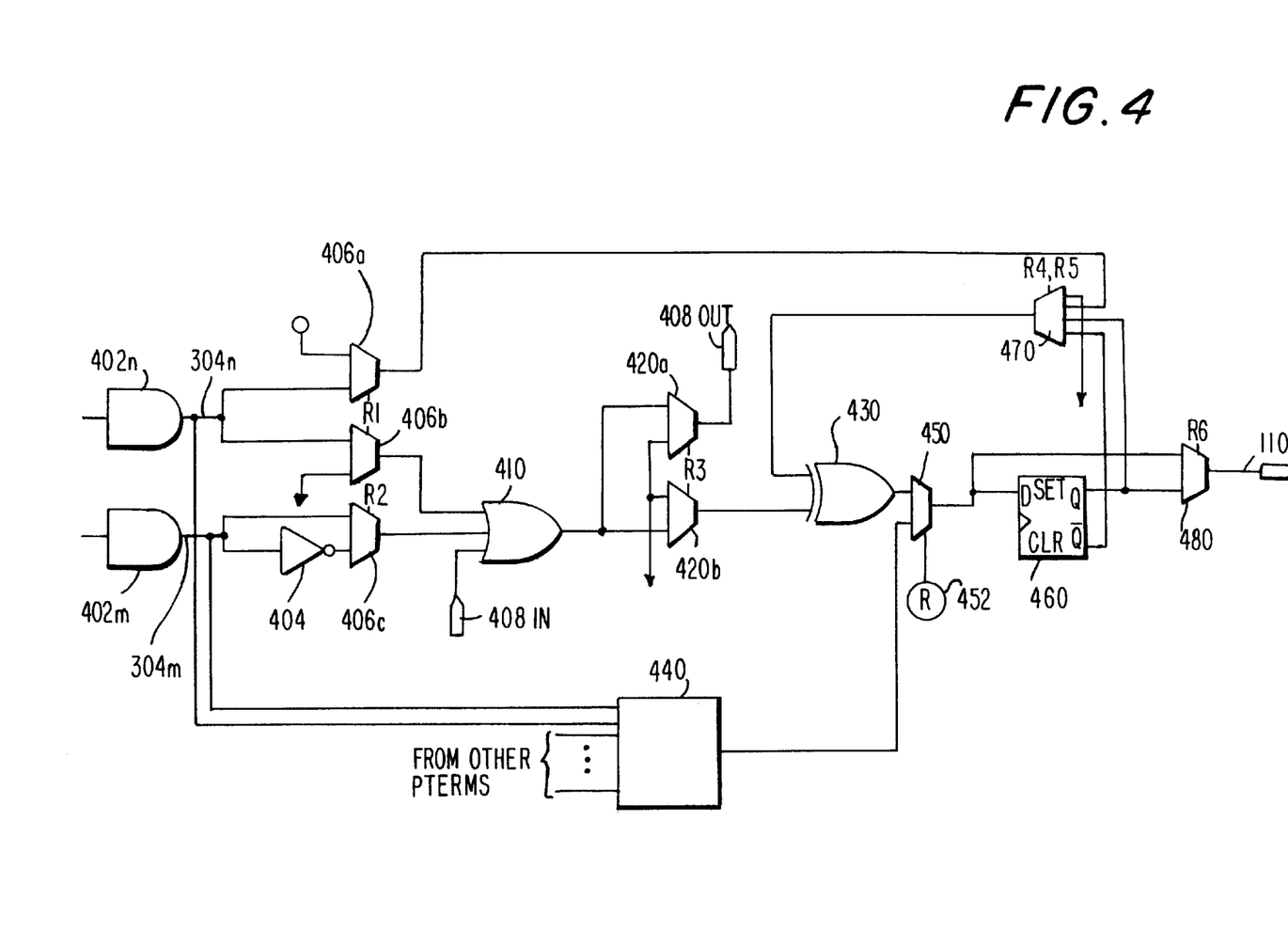
FIG. 4 is a schematic representation of an illustrative embodiment of a representative part of the output portion of the circuitry shown in FIG. 1.

In FIG. 4 conductors 304n and 304m correspond to two representative instances of conductor 304 in FIG. 3. AND gates 402n and 402m represent the AND function performed by the connection of multiple transistors 36 in FIG. 3 to each conductor 304. The OR function required for sum-of-products logic is performed by or with the aid of elements 404, 406, 410, 420, 430, and 470. The alternate route 440 from conductors 304 to programmable logic connector ("PLC") 450 is used when RAM module 10 is serving as ordinary RAM rather than as p-term logic. The circuitry represented by block 440 may therefore be constructed as shown in the above-mentioned Cliff et al. reference. When used to perform sum-of-products logic, the circuitry shown in FIG. 4 may be thought of as logic macrocell circuitry, and it will sometimes be referred to in that way.

PLC 406a is programmable by FCE R1 to apply either VCC (logic 1) or p-term 304n to one input of PLC 470. PLC 406b is programmable by FCE R1 to apply either p-term 304n or VSS (logic 0) to one input of OR gate 410. PLC 406c is programmable by FCE R2 to apply either p-term 304m or the logical inverse of p-term 304m (produced by inverter 404) to a second input of OR gate 410. The third input to OR gate 410 is a cascade connection 408in from adjacent sum-of-products logic (not shown but similar to the logic shown in FIG. 4 for adjacent p-terms 304). In particular, the cascade in 408in of each macrocell is the cascade out 408out of the adjacent macrocell.

The output of OR gate 410 is applied to one input terminal of each of PLCs 420a and 420b. PLC 420a is programmable by FCE R3 to apply either the output of OR gate 410 or VSS to cascade out 408out. PLC 420b is programmable by FCE R3 to apply either the output of OR gate 410 or VSS to one input terminal of EXCLUSIVE OR gate 430. The other input to EXCLUSIVE OR gate 430 is the output signal of PLC 470. Elements 430 and 470 cooperate to allow the macrocell to produce the EXCLUSIVE OR of the output of OR gate 410 with any of (1) VCC (from PLC 406a), (2) a single p-term 304n output (from PLC 406a), (3) VSS, (4) the Q output of flip-flop 460, or (5) the inverted Q output of flip-flop 460. PLC 470 is programmable controlled by FCEs R4 and R5. PLC 450 is programmable by FCE 452 (which can be the same as FCE 106 in FIG. 1) to select either the output of EXCLUSIVE OR gate 430 or an output of logic 440 for application to the D input of flip-flop 460 and one input of PLC 480. PLC 480 is programmable by FCE R6 to apply either the output of PLC 450 or the Q output of flip-flop 460 to RAM module 10 output lead 110. Thus the macrocell shown in FIG. 4 can output either a registered (Q) or combinatorial sum-of-products signal via conductor 110. Elements 460 and 480 are usable similarly in conjunction with circuitry 440 to provide either a registered or unregistered conventional RAM or ROM output from RAM module 10.

The sum-of-products macrocell circuitry shown in FIG. 4 can be generally similar to the macrocell circuitry shown in Pedersen U.S. Pat. No. 5,121,006, which is hereby incorporated by reference herein.

In the 64-by-32 array 11 shown in FIG. 1, 32 p-terms of 32 inputs each can be provided. By effectively combining different numbers of OR gates 410 in output logic 103, 1 to 16 sum-of-products outputs with between 32 and 2 p-terms per output can be provided. OR gates 410 are effectively combined in this way via the cascade out and cascade in connections 408 described above.

The provision of 32 p-terms of 32 inputs provides wider fan-in and faster circuits than using trees of four-input look-up tables. This may facilitate implementation of more complex logic or state machines. And more than one such array in a programmable logic device can be used in this way.

The write port at lines 101 is not used for the above-described p-term mode operation of module 10. Therefore, the write port is available during p-term operation for writing to array 11. Thus, a device can be provided that is self-modifying, assuming that address data for writing to array 11 can be applied to the array. Although as described, the write address lines are used for p-term inputs, a different arrangement can be used if self-modifying logic is desired. For example, other p-term inputs can be provided in place of using the write address lines that are shown being used for some of those inputs. The write address lines can then remain available for use in modifying the contents of array 11. This ability to write into the p-term block (i.e., array 11) can provide effective implementation of logic for reconfigurable computing applications. For example, the p-term array 11 can be used as a 32-input 16-output multiplexer, giving flexible routing that can be changed on the fly. In addition, using the full power of the p-term to implement logic functions allows significantly different logic functions to be "downloaded" by changing the contents of array 11.

Figure 5:
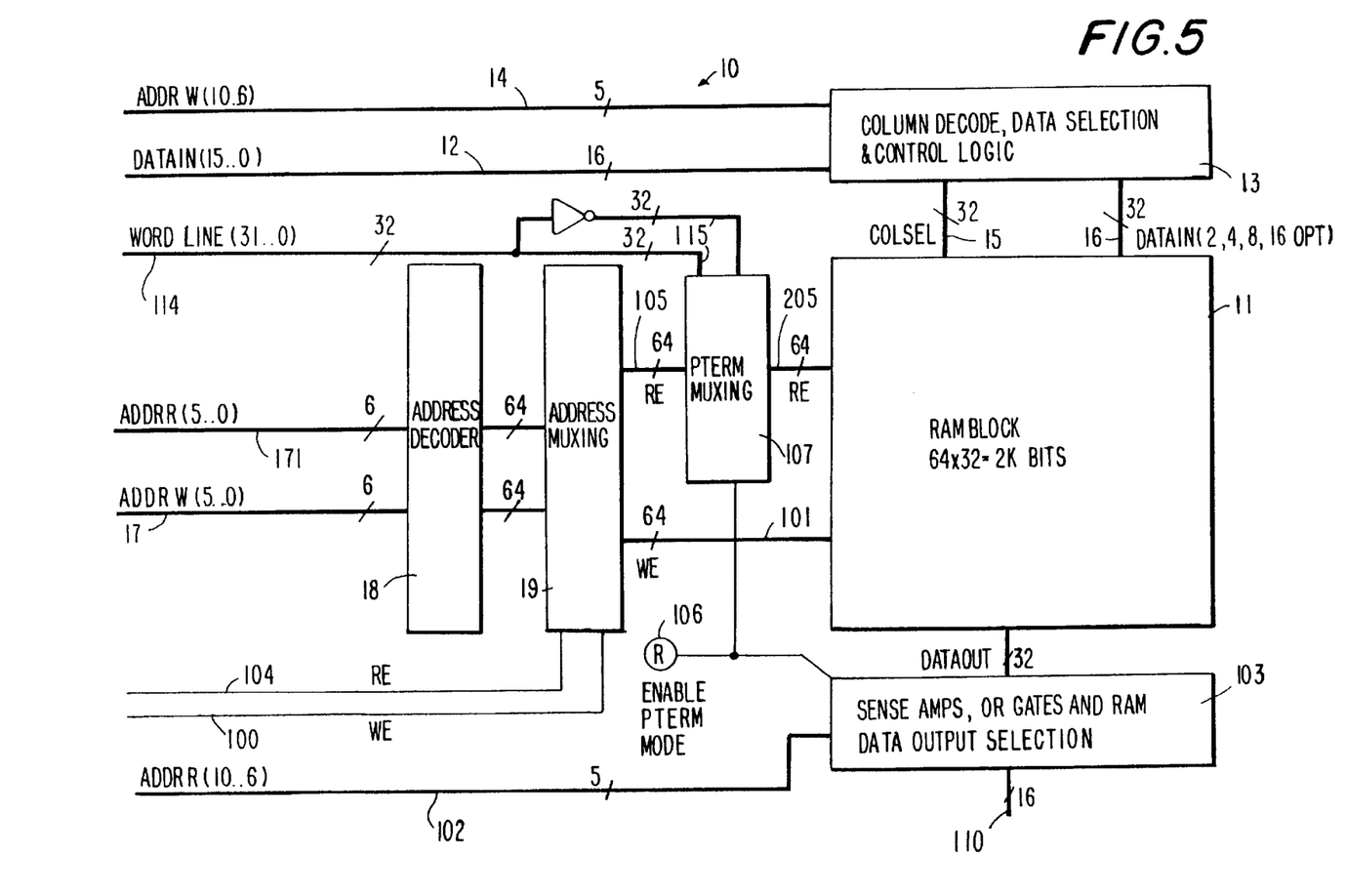
FIG. 5 is generally similar to FIG. 1, but shows an alternative illustrative embodiment in accordance with the invention.

FIG. 5 shows an example of how the circuitry of FIG. 1 can be modified to facilitate writing new data to array 11 to allow complete freedom to change the data in array 11 without interfering with use of the array as a p-term array in sum-of-products logic. In the alternative shown in FIG. 5 the 32 word line signals needed by array 11 in p-term mode come from separate word line signal conductors 114, rather than being "borrowed" from other sources like conductors 12, 14, 102, and 171. (Such independent sourcing of all the word line signals is not absolutely necessary. For example, some of the word line signals could still be "borrowed" as in FIG. 1 from read address conductors 102 and 171 because the signals on these conductors are not needed by elements 18, 19, 103, and 107 in p-term mode operation of the circuitry.) This arrangement of the circuitry allows new data to be written to any cell of array 11 at substantially any time without interfering with use of the array to provide p-term outputs. Accordingly, the circuitry shown in FIG. 5 has all the additional advantageous characteristics described in the immediately preceding paragraph (e.g., the circuitry can implement logic for reconfigurable computing applications, the circuitry can function as a dynamic 32-input 16-output multiplexer, and significantly different p-term logic functions can be "downloaded" into array 11 whenever desired).

By configuring RAM blocks 10 of an SRAM-based look-up-table-type device 20 in the manner shown herein, one obtains a look-up-table-type device that can optionally provide p-term logic functions of large numbers of inputs.

FIG. 6 shows another example of a programmable logic device 20' having RAM blocks 10 embedded among logic blocks 21'. In this case device 20' may be constructed generally as shown in Freeman U.S. Pat. Re. No. 34,363, which is also hereby incorporated by reference herein. Thus each logic block 21' may be a configurable logic block ("CLB") which includes one or two small look-up tables. Each CLB 21' may be surrounded by interconnection conductors 23' for conveying signals to, from, and between CLBs 21' and other circuitry on or off the device. Such other circuitry on the device includes RAM blocks 10. Each CLB 21' may receive signals from the interconnection conductors 23' adjacent to any of its sides. Similarly, each CLB may output signals to any of its sides. As in the embodiment shown in FIG. 2, each RAM block 10 is usable either as ordinary RAM/ROM or to perform p-term logic.

Figure 7:
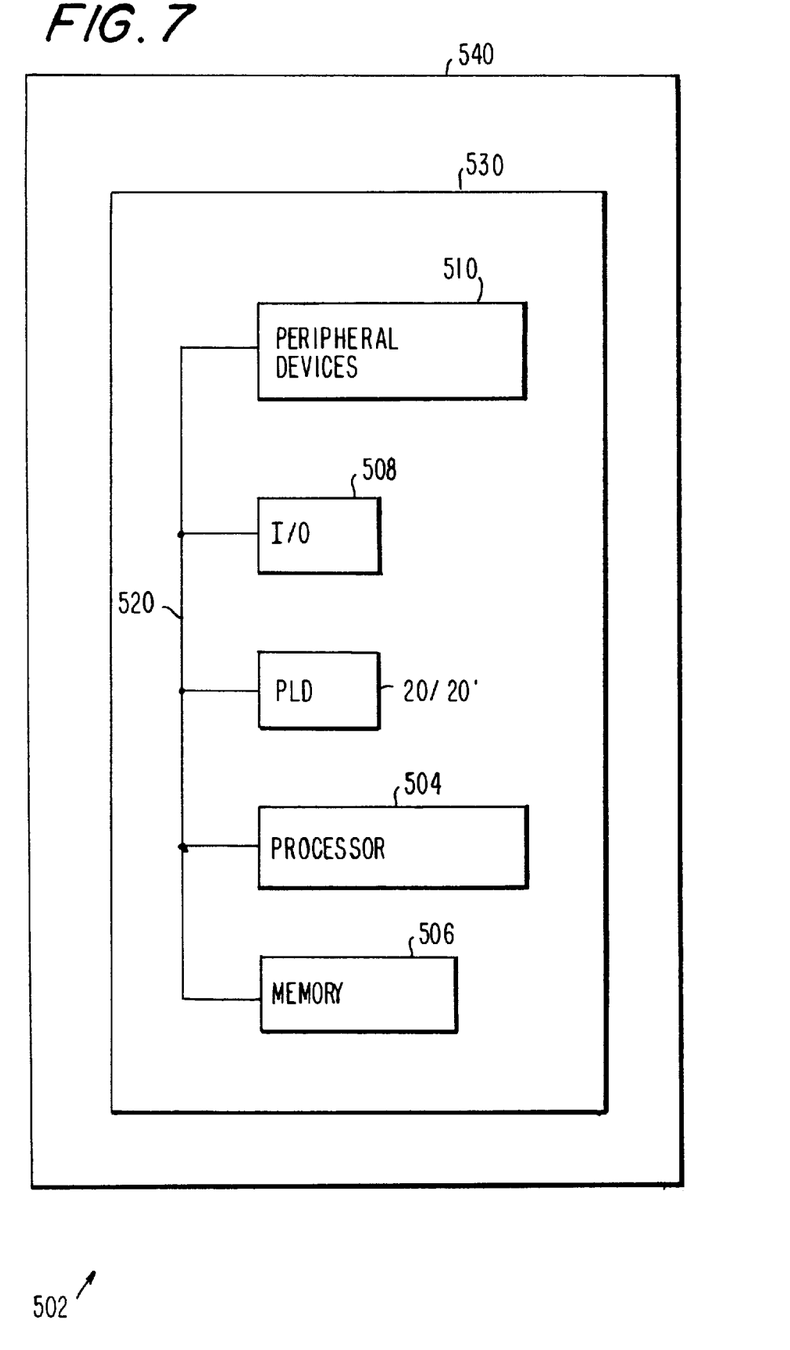
FIG. 7 is a simplified block diagram of an illustrative system employing a programmable logic device incorporating random access memory blocks in accordance with the invention.

FIG. 7 illustrates a programmable logic device 20/20' of this invention in a data processing system 502. Data processing system 502 may include one or more of the following components: a processor 504; memory 506; I/O circuitry 508; and peripheral devices 510. These components are coupled together by a system bus 520 and are populated on a circuit board 530 which is contained in an end-user system 540.

System 502 can be used in a wide variety of applications, such as computer networking, data networking, instrumentation, video processing, digital signal processing, or any other application where the advantage of using programmable or reprogrammable logic is desirable. Programmable logic device 20/20' can be used to perform a variety of different logic functions. For example, programmable logic device 20/20' can be configured as a processor or controller that works in cooperation with processor 504. Programmable logic device 20/20' may also be used as an arbiter for arbitrating access to a shared resource in system 502. In yet another example, programmable logic device 20/20' can be configured as an interface between processor 504 and one of the other components in system 502. It should be noted that system 502 is only exemplary, and that the true scope and spirit of the invention should be indicated by the following claims.

Various technologies can be used to implement programmable logic devices 20/20' employing the RAM modules 10 of this invention, as well as the various components of those RAM modules. For example, function control elements 106 and other FCEs can be SRAMs, DRAMs, first-in first-out ("FIFO") memories, EPROMs, EEPROMs, function control registers (e.g., as in Wahlstrom U.S. Pat. No. 3,473,160), ferro-electric memories, fuses, antifuses, or the like. From the various examples mentioned above it will be seen that this invention is applicable to both one-time-only programmable and reprogrammable devices.

It will be understood that the foregoing is only illustrative of the principles of the invention, and that various modifications can be made by those skilled in the art without departing from the scope and spirit of the invention. For example, the particular numbers of rows and columns of memory cells mentioned above in the description of depicted array 11 are only illustrative, and different numbers of rows and columns (generically N rows and M columns) can be provided instead if desired. The words "row" and "column" are used arbitrarily herein, and no absolute or fixed directions or orientations are intended thereby. For example, these words can be interchanged in this specification and claims if desired. As another example of modifications within the scope of this invention, the polarities of various signals and logic mentioned herein are only illustrative, and other polarities can be used if desired. Thus the fixed potential to which each transistor 37 is connected could be logic 1 rather than logic 0 as shown in FIG. 3, and each data out conductor 304 could have a pull down connection to logic 0 rather than a pull up connection to logic 1 as shown in FIG. 3.

What is claimed is:

1. Memory circuitry comprising:
   a block of memory comprising a plurality of memory cells operatively arranged in a two-dimensional array of intersecting rows and columns of such memory cells, wherein each memory cell has a storage capacity of one bit of binary data; and
   addressing circuitry configured to allow operation of the block of memory in alternative first and second modes, wherein in the first mode the block of memory is configured for use as random access memory, and wherein in the second mode, the block of memory is configured for performing product-term-type logic functions.

2. The memory circuitry defined in claim 1, further comprising:
   a plurality of product-term output lines, each of which is associated with a respective one of the columns of memory cells, wherein each product-term output line is configured to selectively respond to the data stored in the memory cells in the associated column by conveying a product-term signal that is the logical AND of a set of logic values that are associated with the data in the memory cells in the associated column.

3. The memory circuitry defined in claim 2, further comprising:
   control logic circuitry associated with the plurality of product-term output lines, wherein the control logic circuitry comprises a first sum-of-products logic circuit configured to generate a sum-of-products output signal by selectively ORing the product-term signals conveyed on a subplurality of the product-term output lines.

4. The memory circuitry defined in claim 3, wherein the control logic circuitry further comprises:
   a register element associated with the first sum-of-products logic circuit, the register element being configured to selectively output a registered sum-of-products output signal.

5. The memory circuitry defined in claim 4, wherein the control logic circuitry further comprises:

additional sum-of-products logic circuits, wherein each additional sum-of-products logic circuit is similar to the first sum-of-products logic circuit.

6. The memory circuitry defined in claim 5, wherein:
   each sum-of-products logic circuit has cascade connections to and from neighboring sum-of-products logic circuits.

7. A programmable logic integrated circuit device comprising:
   the memory circuitry defined in claim 1;
   a plurality of blocks of programmable logic; and
   a programmable interconnection network for selectively making interconnections among the memory circuitry and the blocks of programmable logic.

8. The device defined in claim 7 wherein each of the blocks of programmable logic includes a programmable look-up table.

9. A digital processing system comprising:
   processing circuitry;
   a memory coupled to the processing circuitry; and
   the programmable logic integrated circuit device defined in claim 7 coupled to the processing circuitry and the memory.

10. A printed circuit board on which is mounted the programmable logic integrated circuit device defined in claim 7.

11. The printed circuit board defined in claim 10 further comprising:
    a memory mounted on the printed circuit board and coupled to the programmable logic integrated circuit device.

12. The printed circuit board defined in claim 11 further comprising:
    processing circuitry mounted on the printed circuit board and coupled to the programmable logic integrated circuit device.

13. Memory circuitry comprising:
    a block of memory comprising a plurality of memory cells operatively arranged in a two-dimensional array of intersecting rows and columns of such memory cells; and
    addressing circuitry having a first subcircuit configured to address multiple columns of the block in parallel, and a second subcircuit configured to be operable in alternative first and second modes, wherein in the first mode the second subcircuit is configured to individually address a respective one of the rows of the block one at a time, and wherein in the second mode, the second subcircuit is configured to address multiple rows of the block in parallel by applying true and complement versions of a set of address signals to multiple rows of the block in parallel.

14. The memory circuitry defined in claim 13, wherein each memory cell has a storage capacity of one bit of binary data.

15. The memory circuitry defined in claim 13, further comprising column logic circuitry associated with each column of memory cells, the column logic circuitry being configured to perform a logic function on a set of logic values associated with data stored in the memory cells in the associated column.

16. The memory circuitry defined in claim 15, wherein in the second mode, the second subcircuit is further configured to apply the set of logic values associated with the data stored in the memory cells in the associated column to the column logic circuitry associated with that column.

17. The memory circuitry defined in claim 16 wherein the logic function performed by the column logic circuitry is a logical AND.

18. A programmable logic integrated circuit device comprising:

the memory circuitry defined in claim 13;

a plurality of blocks of programmable logic; and a programmable interconnection network for selectively making interconnections between the memory circuitry and the blocks of programmable logic.

19. The device defined in claim 18 wherein each of the blocks of programmable logic includes a programmable look-up table.

20. A digital processing system comprising:

processing circuitry;

a memory coupled to the processing circuitry; and the programmable logic integrated circuit device defined in claim 18 coupled to the processing circuitry and the memory.

21. A printed circuit board on which is mounted the programmable logic integrated circuit device defined in claim 18.

22. The printed circuit board defined in claim 21 further comprising:

a memory mounted on the printed circuit board and coupled to the programmable logic integrated circuit device.

23. The printed circuit board defined in claim 22 further comprising:

processing circuitry mounted on the printed circuit board and coupled to the programmable logic integrated circuit device.

* * * * *